United States Patent [19]

Alexander et al.

[11] Patent Number: 5,367,484
[45] Date of Patent: Nov. 22, 1994

[54] PROGRAMMABLE HIGH ENDURANCE BLOCK FOR EEPROM DEVICE

[75] Inventors: Samuel E. Alexander, Gilbert; Stephen V. Drehobl; Richard J. Fisher, both of Phoenix; Leonard F. French, Chandler; Kent D. Hewitt, Tempe, all of Ariz.

[73] Assignee: Microchip Technology Incorporated, Chandler, Ariz.

[21] Appl. No.: 41,642

[22] Filed: Apr. 1, 1993

[51] Int. Cl.$^5$ .............................................. G11C 11/34
[52] U.S. Cl. .................................. 365/185; 365/900; 365/200; 365/230.03
[58] Field of Search ................... 365/185, 900, 230.03, 365/200, 240, 189.01, 94, 103, 51, 184

[56] References Cited

U.S. PATENT DOCUMENTS

| | | | |
|---|---|---|---|
| 4,386,421 | 5/1983 | Inagaki | 365/240 |
| 4,758,988 | 7/1988 | Kuo | 365/200 |
| 5,034,926 | 7/1991 | Taura et al. | 365/230.03 |

Primary Examiner—Eugene R. LaRoche
Assistant Examiner—Huan Hoang
Attorney, Agent, or Firm—O'Connor, Cavanagh

[57] ABSTRACT

An erasable programmable memory device has a number of data storage blocks. Each block has an endurance characteristic that at least roughly defines the number of times data may be erased from and written to the block before it wears out in that data cannot then be further erased from and written to the block. A redundant data storage block of memory capacity and endurance similar to that of each of the other data storage blocks is disposed in parallel with a selected one of the latter for which higher endurance is desired. This enables identical data to be written simultaneously to the two blocks and thus considerably increases the endurance of the selected block by virtue of the fact that identical memory cells in both blocks must fail before the endurance of the selected block will be depleted. After the selected block has been designated for high endurance and placed in parallel with the redundant block, a fuse may be set to prevent alteration of that designation.

12 Claims, 6 Drawing Sheets

CONTROL SEQUENCE BIT ASSIGNMENTS

| CONTROL BYTE | | ADDRESS BYTE 1 | ADDRESS BYTE 0 | SECURITY BYTE | | | |
|---|---|---|---|---|---|---|---|
| SLAVE ADDRESS | DEVICE SELECT R/W | S X X A12–A8 | A7–A0 | E/W | R | X X | BLK CNT |
| 7 0 | 7 | 4 0 | 7 0 | 7 | 6 | 5 4 | 3 0 |

FIG. 8A

ENDURANCE BLOCK WRITE (BLOCK ZERO)

| ADDRESS | DEVICE SELECT R/W | S X X A12–A8 | A7–A0 | E/W | R | X X | BLK CNT |
|---|---|---|---|---|---|---|---|
| 1010 | 000 0 | 1 X X 0000X | XXXXXXXX | 0 | 0 | X X | 0000 |

BLOCK SELECT BITS

FIG. 8B

PROGRAMMABLE HIGH ENDURANCE BLOCK FOR EEPROM DEVICE

BACKGROUND OF THE INVENTION

The present invention relates generally to semiconductor integrated circuit (IC) memory chips or devices, and more particularly to erasable programmable memory devices such as electrically erasable (alterable) programmable read only memories (EEPROMs).

EEPROM devices have the distinct advantage of allowing data to be written and rapidly erased electrically many times over, to permit a user to change the stored data at will while the device is in circuit. In contrast, the older PROM-type devices employ fusible links in which data is stored according to the condition of the fuses at intersections of the memory array, i.e., the condition of whether or not a fuse is blown. As such, a PROM device is, for all intents and purposes, programmable only once (that is, is non-erasable) since a blown fuse is not reparable.

Another type of erasable programmable memory, the EPROM device, requires exposure of the unhoused structure to ultraviolet (UV) light to change the electrical characteristics of a charged element in order to obtain erasure. Typically, the EPROM is housed in a windowed package (e.g., a ceramic package having a quartz window to expose the silicon), although a more recent version dubbed as "one time programmable" (OTP) is packaged in plastic without a window. As the name indicates, the windowless variety can be programmed only once. For the usual windowed EPROM that has been programmed, however, reprogramming is a major effort. If installed, the device must be removed from its in-system circuit, exposed to UV for a sufficient period of time (several hours) to assure complete erasure of the stored data, reprogrammed electrically, and then reinstalled in circuit.

The use of EEPROM devices avoids the need to subject the memory to long periods of outage for erasure. This, then, is the device of choice for applications where fast storage changes are required. In the EEPROM structure, a pair of polysilicon gates are separated by a silicon dioxide layer. The oxide also extends below the lower gate to separate it from underlying p-type silicon substrate in which a channel may be established between implanted heavily doped n-type source and drain regions. The oxide thickness between the lower gate and the silicon typically ranges up to about 100 angstroms, which is considerably less than the gate oxide thickness used for EPROM structures.

In operation of the EEPROM, a voltage of suitable magnitude applied across the very thin gate oxide layer induces tunneling of electrons from the substrate to the lower gate. A logical 1 is stored (written) when a write voltage is applied to the upper gate, thus inducing a charge on the lower gate that prevents a channel from forming during a read operation. A reversal of the write voltage causes erasure.

The endurance of an electrically erasable programmable memory refers to the number of times it may successfully be erased and rewritten (reprogrammed) during its lifetime. For all known devices, this is a finite number that depends on the processing and structural factors of the individual memory cell of the device as well as its operational environment. The typical EEPROM device marketed today "wears out", i.e., cannot be reprogrammed, after a few thousand erase/write cycles. This is a measure of its endurance.

In many current applications, it is desirable to provide greater endurance because of the number of times the memory or a particular portion or block of the memory array may be reprogrammed in normal use. Wearout of the EEPROM device used in such applications, such as for the "last number redial" feature of a standard electronic telephone set, essentially eliminates that feature from the telephone. In some instances, the eliminated feature is of such importance that the end product of which the EEPROM device is a component is rendered useless.

The use of high endurance memory to overcome this problem makes the EEPROM sufficiently more costly to be uneconomical and uncompetitive in today's global marketplace, where extremely high volume competitive applications lead to customer demands for component cost reduction.

Accordingly, it is a principal object of the present invention to provide improvements in endurance of erasable programmable memory arrays without substantially increasing the cost of such arrays.

A more specific object of the invention is to provide an erasable programmable memory array having a capability for programmable high endurance for certain applications.

SUMMARY OF THE INVENTION

Briefly, the present invention provides an arrangement for programming a desired block of memory among all of the memory blocks of the data memory of an erasable programmable memory array, for example an EEPROM array, to have a high endurance characteristic despite its normal low endurance characteristic which is the same as that of the other memory blocks of the data memory. A redundant block of memory of the same capacity (size) and substantially the same endurance as that of each of the blocks of the data memory is placed in parallel with the designated high endurance block. By doing so, the designated block and the redundant block are subjected to simultaneous erasure, writing or reading of the same data.

In those circumstances, failure (breakdown, or wearout) of either of the two memory blocks requires that identical memory cells in the two blocks would have to fail in precisely the same way. That is highly unlikely to occur except over a number of erase/write cycles which is considerably (orders of magnitude) greater than would be predicted by the normal low endurance characteristic of either memory block alone. The designated block of the data memory therefore takes on a high endurance characteristic by virtue of a phenomenon akin to probability theory.

In the exemplary embodiment of a 64K-bit EEPROM, the memory has 16 4K-bit blocks, and each block is addressable by writing to a four-bit register. The register may thus be used to designate the block of data memory which is to be made high endurance by an associated pointer that places the block whose address is written to the register in parallel with the redundant memory block. The effect is to provide the EEPROM with the capability for programming any block of the data memory to be a high endurance block.

The invention is particularly advantageous in certain applications, such as "last number redial" or "speed dial" applications in the personal communications market, where a relatively small amount of data (the contents of the designated high endurance block) must be altered repeatedly, while a vastly larger amount of data (the contents of the remaining blocks of the data memory) need be altered only a few times. The scheme is also a relatively low cost solution to the problem of providing high endurance memory capability.

Therefore, another object of the invention is to provide an EEPROM device having a data memory composed of a multiplicity of contiguous blocks of equal capacity, low endurance memory, and having means for selectively and greatly increasing the endurance of one of the memory blocks.

A related object is to provide such a device in which the means for selectively increasing endurance includes means for designating the high endurance block among the multiplicity of blocks of the data memory, and means for erasing and writing the same data from and to the designated high endurance block and a redundant separate block of memory of the same storage capacity.

A further object of the invention is to provide an erasable programmable memory with a plurality of memory means of substantially equal data storage capacity adapted for cyclical erasure and storage of data to be read therefrom over a limited substantially predetermined number of cycles until depleted, and enhancement means for considerably increasing the number of cycles over which a selected one of the plurality of memory means may be subjected to erasure and storage before depletion.

Still another object is to provide a method of increasing at will the endurance for erasure and writing of data in a selected memory portion of an erasable programmable memory device.

BRIEF DESCRIPTION OF THE DRAWINGS

The above and other objects, features and advantages of the invention will become clear from the following detailed description of the best mode presently contemplated for practicing the invention, with reference to the accompanying drawings in which.

DETAILED DESCRIPTION OF THE PREFERRED EMBODIMENT AND METHOD

In the preferred embodiment, the invention is implemented in a 64K (8K×8) low voltage serial EEPROM 10 (FIG. 1) especially suited for low power applications, such as are found in the personal communications market (e.g., cellular telephones), data acquisition, so-called "smart cards", and so forth.

Figure 1:
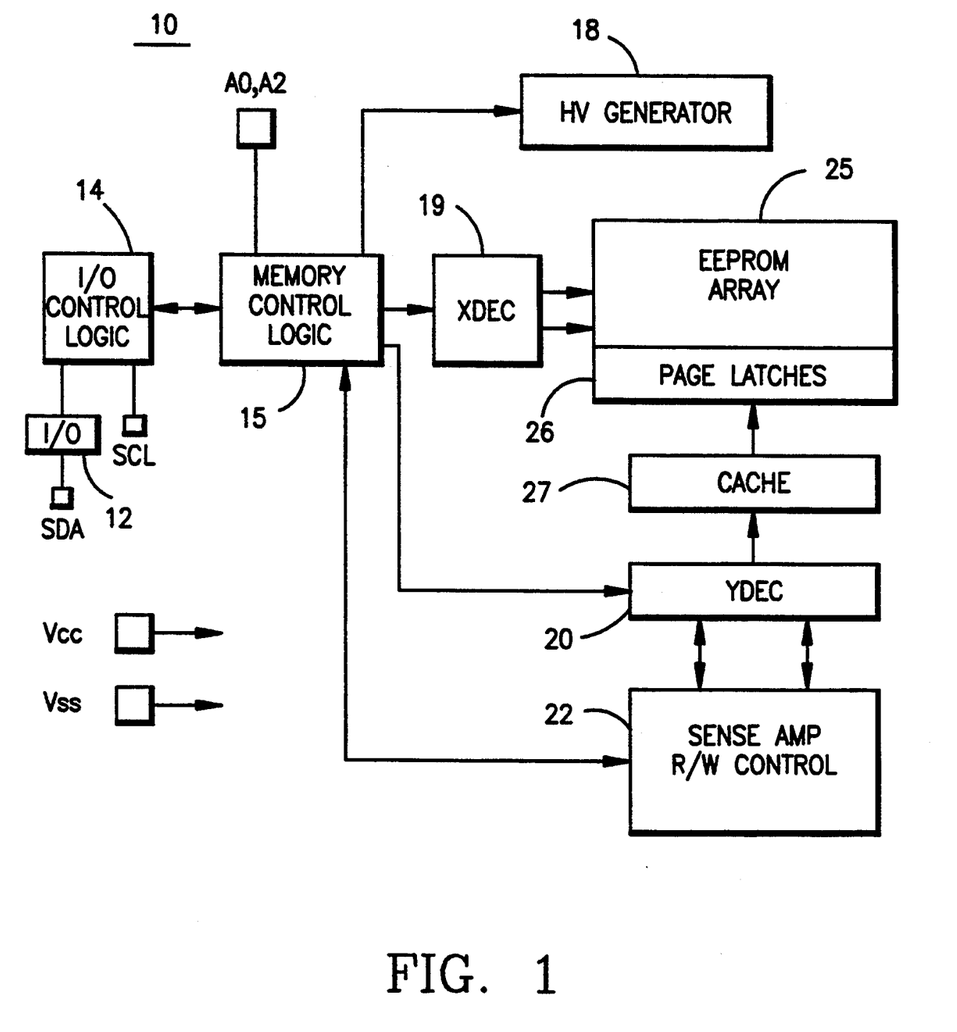
FIG. 1 is a block diagram of a serial EEPROM in which the preferred embodiment of the invention is implemented.

EEPROM 10 includes pins A0, . . . , An, which in this example are A0, A1 and A2 user configurable chip selects, and pins SDA (serial address/data input/output (I/O)) and SCL (serial clock). The A0, A1 and A2 chip address inputs are used by the device for multiple device operation and conform to the I$^2$C bus standard. The level on these pins defines the address block occupied by the device in an address map. This address may then be compared to the corresponding bits in the slave address for selecting the appropriate device from among the multiple devices.

The SDA pin is bidirectional and used to transfer addresses and data into the device, and data out of the device. The pin is an open drain terminal. For normal data transfer, the SDA is allowed to change only during SCL low. Changes during SCL high are reserved for indicating start and stop conditions (described below). The SCL serial clock input is used to synchronize the data transfer from and to the device.

Pins $V_{SS}$ and $V_{CC}$ are for electrical ground and power supply (e.g., +1.8 V to 5.5 V), respectively.

The device has an I/O interface 12 and I/O control logic 14 that communicates with memory control logic 15. Control logic 15 supplies inputs to HV (high voltage) generator 18, XDEC (X-line decoder) 19, YDEC (Y-line decoder) 20, and also communicates with sense AMP (amplifier) R/W (read/write) control 22. The XDEC controls EEPROM array 25 with page latches 26 that are controlled by cache 27 and in turn by YDEC 20. The latter also communicates with sense AMP R/W control 22.

Device 10 is fabricated using CMOS process technology to render it more suitable for low power nonvolatile code and data applications. The device is conveniently packaged in an 8 pin (A0, A1, A2, $V_{SS}$, $V_{CC}$, NU (not used), SCL and SDA) DIP (dual in-line package) or SOIC (small outline integrated circuit) package.

Figure 2A:
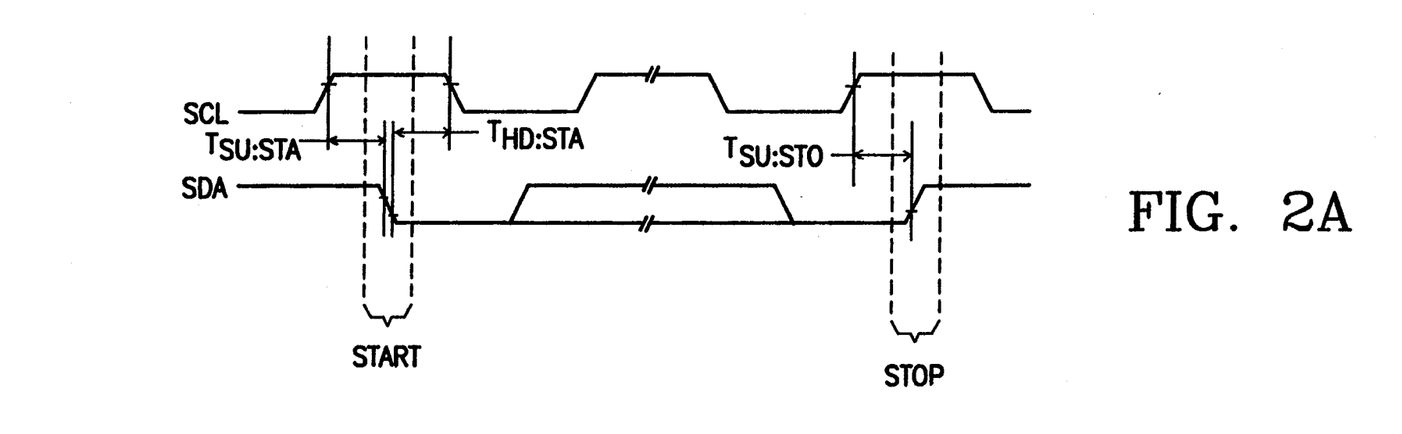
FIGS. 2A and 2B are timing diagrams for the data transmission bus of the device of FIG. 1.
Figure 2B:
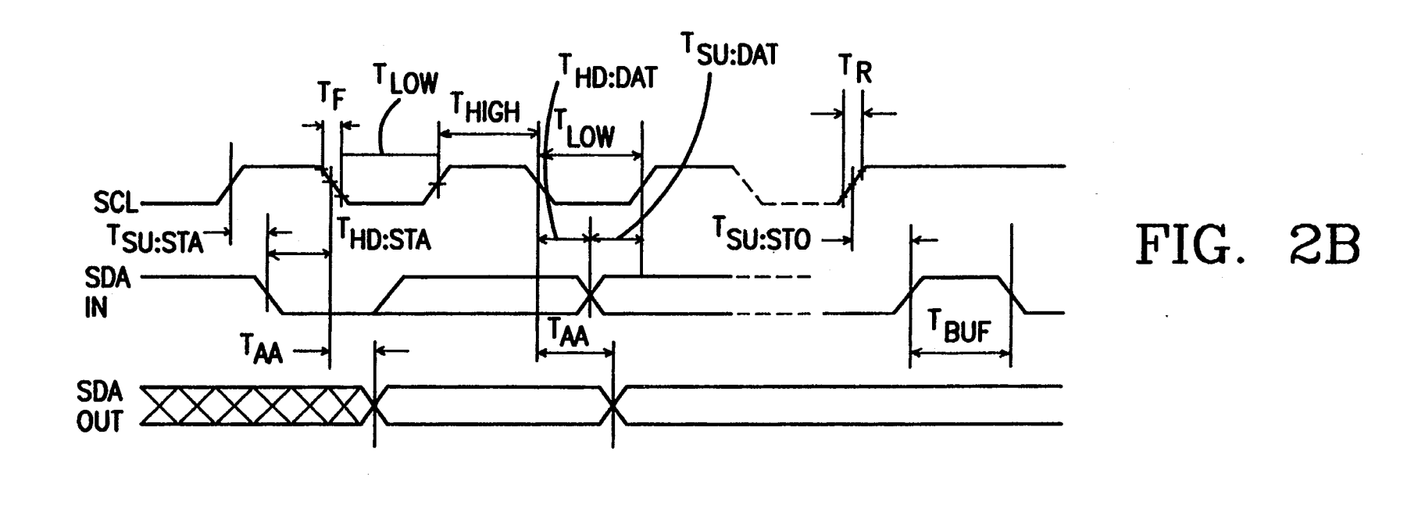

The EEPROM supports a bidirectional two wire bus and data transmission protocol. Bus timing start/stop and bus timing data are illustrated in FIGS. 2A and 2B, respectively. In the protocol, a transmitter sends data onto the bus, and a receiver receives the data. The bus is controlled by a master device that generates the serial clock SCL, controls the bus access, and generates start and stop conditions for data transfer. The EEPROM acts as a slave device, and, like the master, can operate as transmitter or receiver, but the master device determines which of those modes is activated.

FIGS. 2A and 2B assume an exemplary clock frequency of 400 KHz, with data transfer start and stop conditions generated during selected clock high times $T_{HIGH}$ (e.g., minimum of 600 nanoseconds, ns). The clock high time, and the clock low time $T_{LOW}$ (e.g., 1300 ns), lie between the approximate midpoints of the clock rise time $T_R$ (e.g., maximum of 300 ns) and fall time $T_F$ (e.g., max 300 ns), and vice versa, respectively. The start condition hold time $T_{HD:STA}$ (e.g., rain 600 ns) is the period after which the first clock pulse is generated. A start condition setup time $T_{SU:STA}$ (e.g., min 600 ns) is only relevant for repeated start conditions. Analogous considerations exist for stop condition hold time $T_{HD:STO}$ and setup time $T_{SU:STO}$ (e.g., min 600 ns).

Data input hold time and data input setup time are labeled as $T_{HD:DAT}$ (e.g., min 0 ns) and $T_{SU:DAT}$ (e.g., min 100 ns) respectively, in FIG. 2B. When the EEPROM device 10 acts as a transmitter, it must provide an internal minimum delay time $T_{AA}$ (e.g., max 900 ns) to bridge an undefined region (e.g., min 300 ns) of the falling edge of SCL to avoid unintended generation of start and stop conditions. The bus must be free for a time interval designated $T_{BUF}$ (e.g., min 1300 ns) before a new transmission can start.

In the bus protocol of the device:
data transfer may be initiated only when the bus is not busy; and
during data transfer, the data line must remain stable whenever the clock line is high; changes in the data line while the clock line is high will be interpreted as a start or a stop condition.

This protocol in turn leads to the definition of the following bus conditions. The letters A, B, C and D in this part of the description refer to like characters in the illustrative data transfer sequence on the serial bus of FIG. 3. The bus is not busy (A) when both the data (SDA) and clock (SCL) lines remain high. A start data transfer (start condition, B) is determined by a high to low transition of the SDA line while the SCL line is high. All commands must be preceded by a start condition. A stop data transfer (stop condition, C) is determined by a low to high transition of the SDA line while the SCL line is high. All operations must be ended with a stop condition. In other words, each data transfer is initiated with a start condition and terminated with a stop condition.

Figure 3:
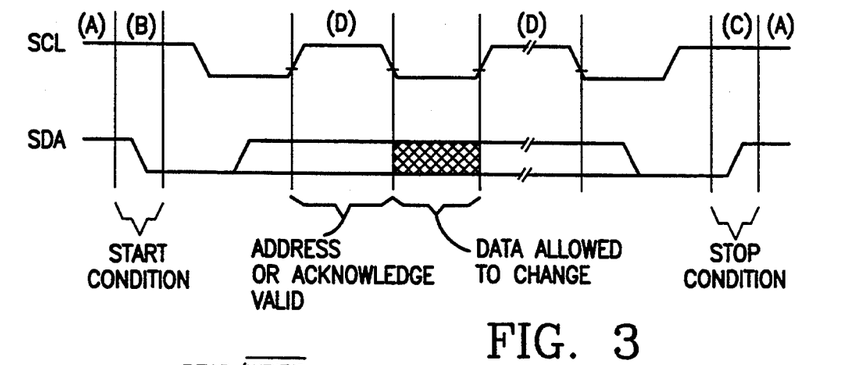
FIG. 3 is a data transfer sequence diagram for the EEPROM's serial bus.

The state of the data (SDA) line represents valid data (D) when, after a start condition, the data line is stable for the duration of the high period of the clock (SCL) signal. The data on the SDA line may be changed only during the low period of the SCL signal. One clock pulse occurs per bit of data. The number of data bytes transferred between the start and stop conditions is determined by the master device. An acknowledge is generated by the addressed receiving device after the reception of each byte.

Figure 4:
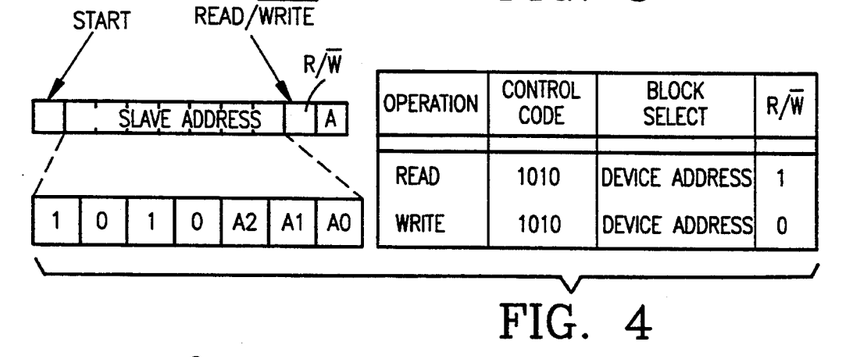
FIG. 4 is a chart illustrating the control byte allocation used for device addressing and operation.

The first byte received from the master device after the start condition is a control byte. The control byte allocation is illustrated in the chart of FIG. 4, and, in this example, the byte includes a four bit control code, set as 1010 binary for read and write operations. The next three bits of the byte are device select bits used by the master device to select which of a possible eight devices is to be accessed. These are the three most significant bits of the word address. The three bits define a device select, so the 8K address in the device must be defined in the 13 least significant bits of the address bytes.

The last bit (R/W) of the control byte defines the operation to be performed, i.e., read or write. If this bit is set to a 1, a read operation is selected; if set to a 0, a write operation is selected. The bit designated A in FIG. 4 is the acknowledge bit, a valid low data in this case sent by the slave to indicate receipt of the previous eight bits. An acknowledge occurs after each byte transmitted in either direction.

The least significant thirteen bits of the next two bytes from the master device define the address of the byte on which the device will perform subsequent read or write operations.

Following a start condition, EEPROM device 10 monitors the SDA line to check the device type identifier transmitted by the master. On receiving a 1010 code and the device select bits, the slave device so selected outputs an acknowledge signal on the SDA line, and a read or write operation is selected depending on the state of the R/W bit.

In a byte write operation (FIG. 5), after the start condition from the master, the device code (4 bits), block address (3 bits) and R/W bit, which is a logic low (0) are placed onto the bus by the master transmitter. This indicates to the addressed slave receiver that a byte with a word address will follow the control byte, after the slave generates an acknowledge bit during the appropriate clock cycle.

Figure 5:
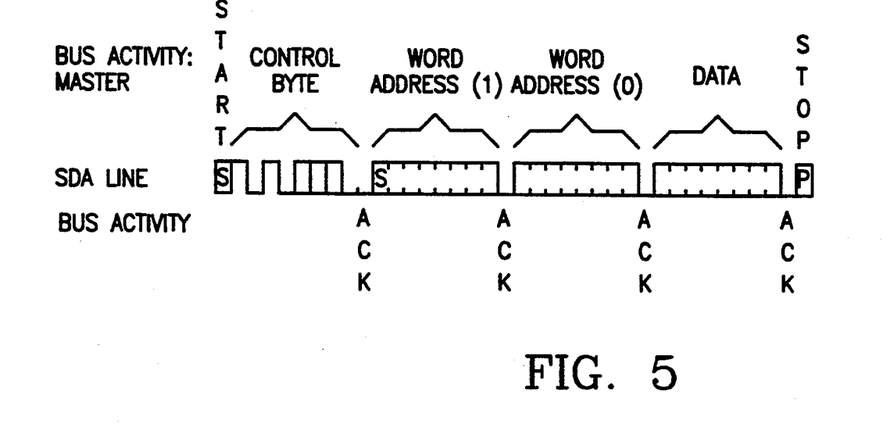
FIG. 5 is a bit stream diagram for explaining a byte write operation.

The next byte transmitted by the master, then, is the first byte of the word address, which is written into the address pointer of the device. After device 10 receives another byte or bytes to the least significant address byte and issues an acknowledgement, the master device transmits a data word to be written into the addressed memory location. This is followed by another acknowledge signal from the slave (device 10) and a generation of a stop condition by the master. In response, the internal write cycle is initiated, during which the EEPROM device generates no further acknowledge signals.

In the page write operation (FIG. 6), the write control byte, word address and first data byte are transmitted to the serial EEPROM device 10. This is the same as described above for a byte write. However, at that point (after acknowledgement of the data byte) the master transmits up to eight pages of eight data bytes, for example, where the cache is eight pages by eight bytes/page, as in this embodiment. These are temporarily stored in the on-chip 64-byte page cache 27, to be written into the memory of device 10 after the master transmits a stop condition. The lower order address pointer bits are internally incremented, while the higher order word address bits are held constant.

Figure 6:
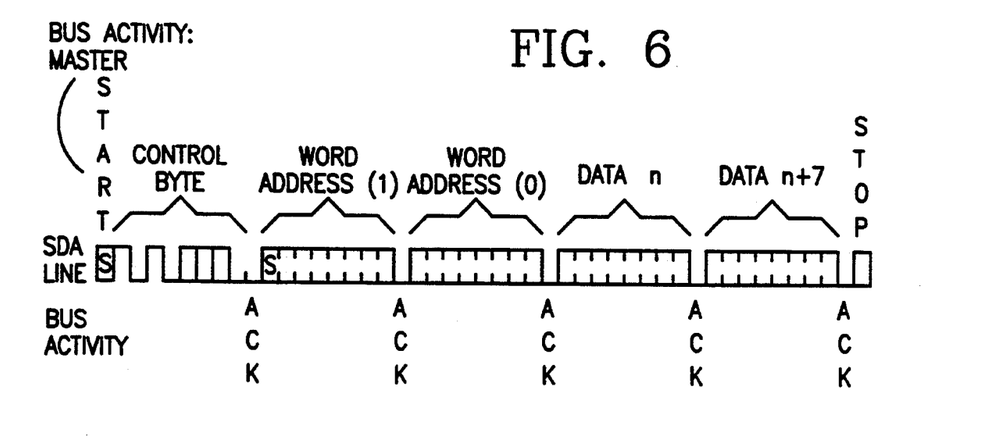
FIG. 6 is a bit stream diagram for explaining a page write operation.

If more than eight bytes are generated before a stop condition, the pointer is incremented to point to the next line in the cache. This can continue up to eight times (eight lines, 64 bytes) or until the cache is full, at which time the pointer will roll over if a stop condition was not transmitted previously at any time during the transfer. Upon receipt of the stop condition, the EEPROM device commences an internal write cycle. The cache continues to capture data until a stop condition occurs or the page write operation is aborted.

When writing data to the EEPROM device, the internal write cycle is executed as an automatic erase-then-write cycle. This total write cycle time interval $T_{WR}$ (erase plus write) is typically 2 milliseconds (ms) in length, with a maximum length of 10 ms, for a single page of eight bytes. The total time required for loading a greater number of pages into write cache 27 is the single page $T_{WR}$ multiplied by the total number of pages being written.

The blocks of memory in the EEPROM's data memory typically have an endurance of about 5000 erase-/write (E/W) cycles before wearout. It may be desirable, however, to have available a high endurance block of the memory to be used for last number redial or speed dial in a personal communications application, for example, with an endurance 1 million or more E/W cycles.

Figure 7:
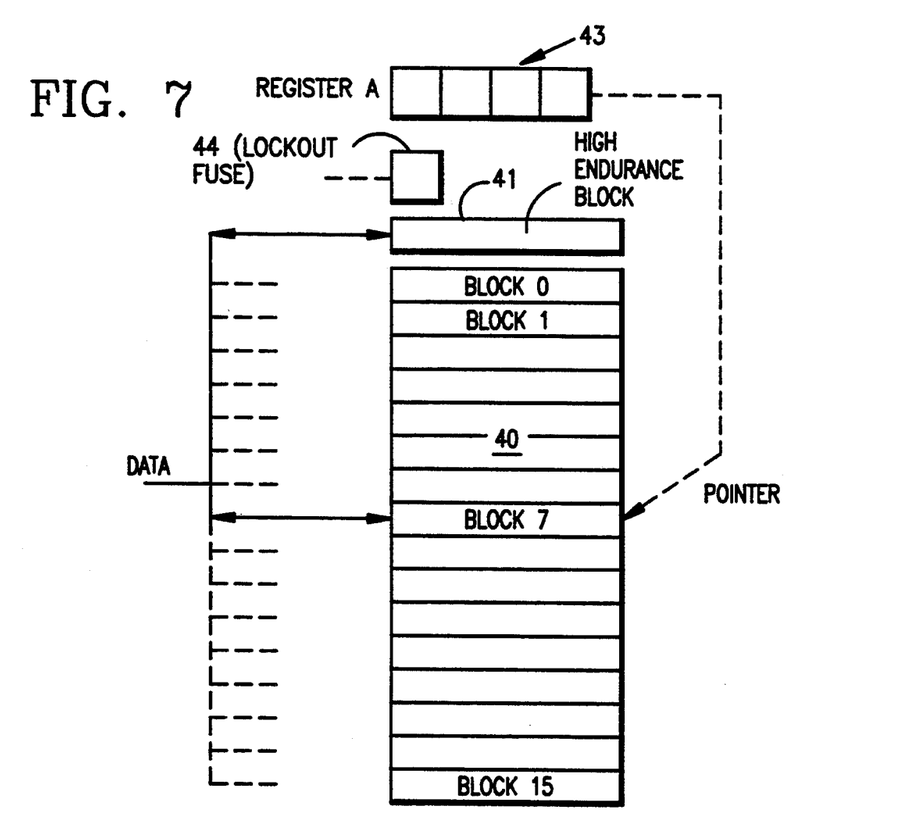
FIG. 7 is a simplified diagram illustrating selection of the regular memory block to be paralleled with the redundant block for high endurance.

Referring to FIG. 7, assume that it is desired to imbue block 7 of data memory 40 with the desired high endurance characteristics. To that end, a separate redundant block 41 of memory, of the same or substantially the same endurance characteristic as each of the blocks of memory 40, is implemented off- or, preferably, on-chip. Block 41 has the same bit storage capacity or size as that of block 7 and of each of the other blocks of the memory array. The redundant block 41 is programmed to be placed in parallel with the desired high endurance block 7 so that the two blocks will be subjected to simultaneous writing, reading, and erasure of their identical cells.

The parallel coupling is accomplished by writing the desired block number (address) to a four-bit register 43, block number 7 in this example. The register can accommodate the address of any of the 16 addressable blocks of memory 40 in the four bit sequence, and thus be used to designate (program) any one of them as the high endurance block of the data memory 40. Only one block may be so designated, however, because only one redundant memory block is available to be paralleled. A pointer associated with register 43 causes any data written to memory block 7 to be written as well to redundant block 41, and the same to be true for erasure or reading of data from block 7.

Since identical data is erased or written simultaneously from or to the two blocks, the endurance of each of them is considerably enhanced simply because the probability that identical memory cells in both blocks will undergo failure (wearout, or loss of endurance) is remote compared to the probability that any given cell in a single block will fail. The latter probability, and hence much lower endurance, exists with each of the other blocks in data memory 40.

After the desired identity of the high endurance block of data memory 40 has been programmed, a lockout fuse modeled as a one-bit register 44 may be utilized and written to (set) to preclude access to register 43 by effectively opening the data (address programming) path to register 43. This will prevent alteration of the address of the designated HE (high endurance) block of memory 40.

Figure 8A:
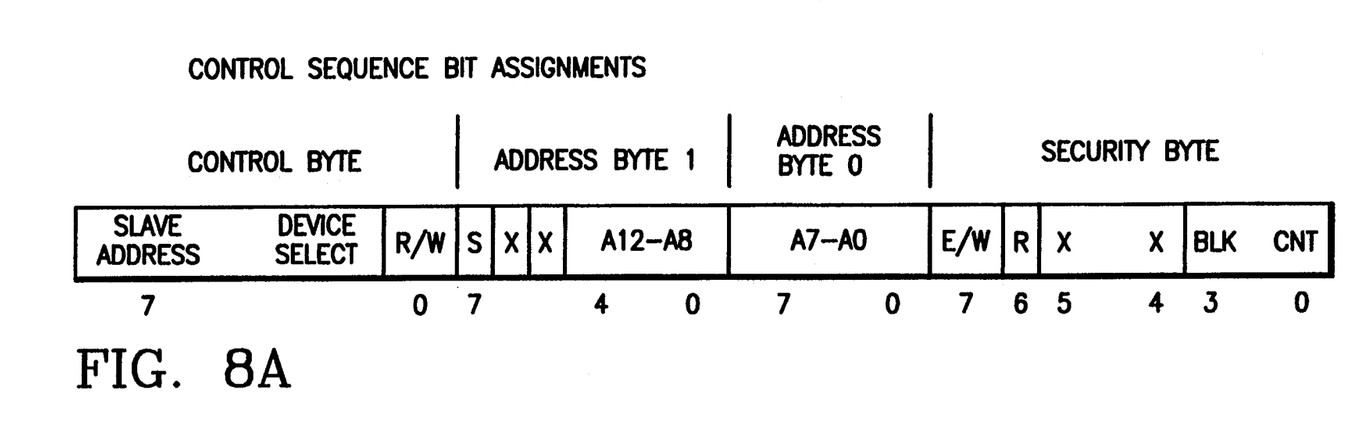
FIGS. 8A and 8B are diagrams of the control sequence bit assignments and the endurance block write, respectively, in the exemplary embodiment for high endurance block selection.

FIG. 8A illustrates control sequence bit assignments for selection of various options in the EEPROM device. The control byte includes slave address, device select and read or write (R/W) selection. This is followed by two eight-bit (0–7) address bytes, and an eight-bit security byte. For the sake of completeness, it should be noted that as one option, the device may have a sophisticated security mechanism by which a block of memory may be write protected by the user. The write sequence includes a bit—bit 7 of the first address byte—for enabling this security protection scheme. When that bit is set to a one, the first byte following the address (denoted as the security byte in FIG. 8A) during a write sequence defines the security. The security byte includes a erase/write (E/W) flag, a pointer to the starting 4K block to be write protected (the block select bits in the first address byte), and a four bit code for determining the number of 4K blocks to be protected.

During a normal write sequence, if an attempt is made to write to or across a protected block, the device ignores the write sequence to this block. Any data written to unprotected blocks will be written, even though a security boundary may be crossed. The designated HE block 7 of the above example would be intentionally left unprotected, however, because the mere fact of designating a particular block to have a high endurance characteristic means that it is intended to be erased and written to repeatedly, over perhaps thousands upon thousands of E/W cycles during the use of the EEPROM. That is, there is no reason to write protect it.

Figure 8B:
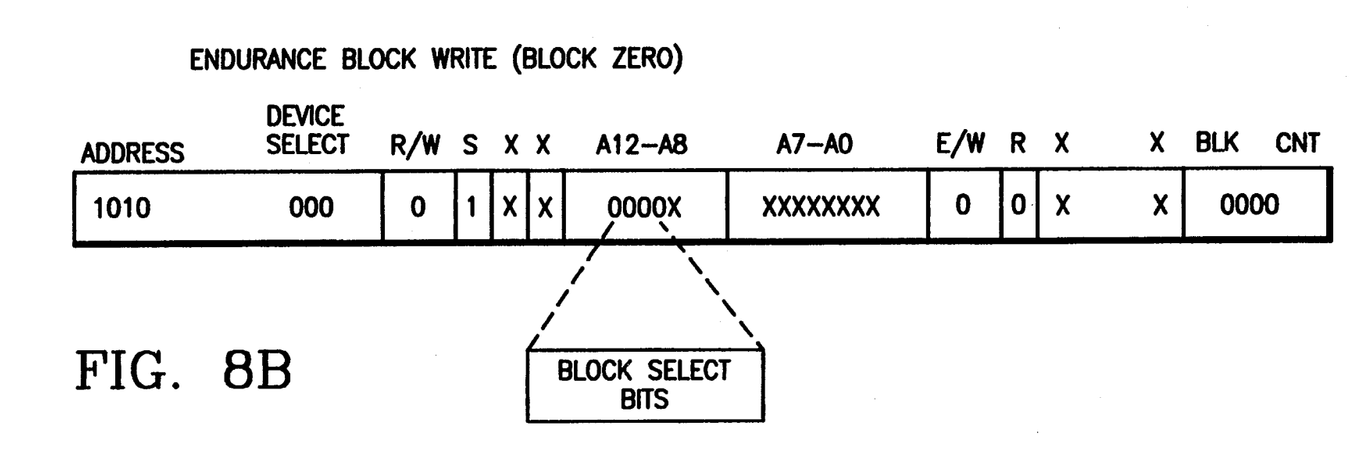

FIG. 8B shows an exemplary endurance block write for block zero, in the selection or programming process. The technique for defining where the high endurance block (the block designated to have the high endurance characteristic) starts in the 64K array is as follows. Bit 7 is set high (1) and the appropriate other bits of the byte are set low (0) to execute the "set high endurance block" command. The address loaded in this command is actually the address of the first memory location in the 4K block of regular memory which is to be set to high endurance by the paralleling with redundant block 41, as described above.

Read operations are initiated in the same way as write operations except that the R/W bit of the slave address is set to 1 rather than 0. The three types of read operations for the EEPROM device 10 are (1) current address read, (2) random read, and (3) sequential read.

Figures 9, 10:
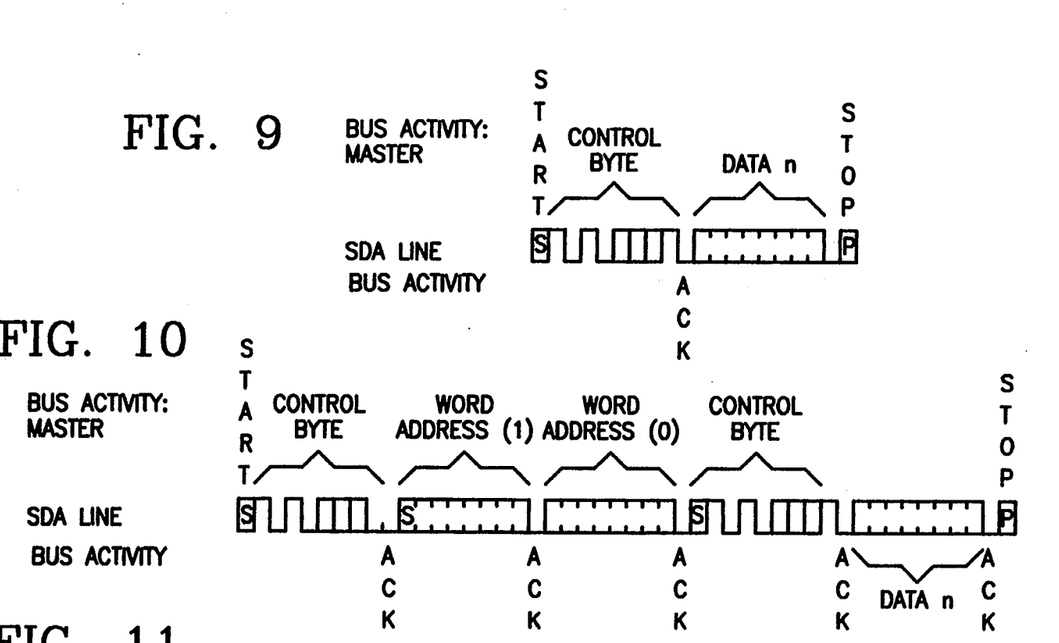
FIG. 9 is a bit stream diagram useful to explain a current address read operation in the EEPROM device.
FIG. 10 is a bit stream diagram useful to explain a random read operation in the EEPROM device.

In a current address read operation (FIG. 9), an address pointer within memory control logic 15 (FIG. 1) of device 10 maintains the address of the last word accessed, which is internally incremented by one after each read operation. That is, if the previous access in a read or write operation was to an address n, where n is any permitted address, the next current address read operation will access data from address n+1. The device (slave) issues an acknowledge and transmits an eight-bit data word from the indicated address in response to receipt of the slave address with R/W bit set to 1. The master then generates a stop condition and the device discontinues transmission.

In a random read operation (FIG. 10), the master is allowed to access any memory location in a completely random manner. The word address is first set by sending it to the EEPROM device as part of a write operation, after which the master generates a start condition following the acknowledge from the device. As a result, the write operation is terminated but the internal address pointer is already set. The control byte is again issued by the master, except that now the R/W bit is set to 1. Consequently, the device acknowledges and transmits the eight-bit data word for the applicable address. The master then generates a stop condition and the device discontinues transmission.

Figure 11:
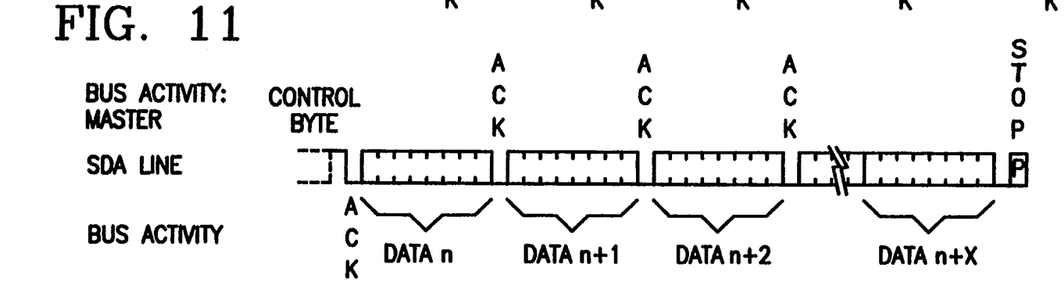
FIG. 11 is a bit stream diagram useful to explain a sequential read operation in the EEPROM device.

In a sequential read operation (FIG. 11 ), reads are initiated in the same way as in the random read operation except that after the first data byte is transmitted by the EEPROM, the master issues an acknowledge rather than a stop condition. This directs the EEPROM to transmit the next sequentially addressed data word. For sequential reads, the internal address pointer of the device is incremented by one after each data word transmission, so the next acknowledge from the master results in transmission of the next data word in the memory address sequence. The address pointer thereby allows the entire memory contents to be serially read during one read operation.

A preferred embodiment constituting the best mode presently contemplated for practicing the invention has been described. However, it will be apparent to those skilled in the art that modifications may be made without departing from the true spirit and scope of the invention. Accordingly, it is intended that the invention shall be limited only as required by the appended claims and the rules and principles of applicable law.

What is claimed is:

1. An erasable programmable memory device, comprising a plurality of first means for data storage, each of said first means having identical storage capacity to each of the others of said first means and having a first endurance characteristic at least roughly defining the number of times that data may be erased from and written to the respective first means before the latter experiences wearout in which data cannot further be erased from and written to the respective first means, a second means for data storage having said identical storage capacity and having the same or similar said first endurance characteristic, and programming means for selectively placing one of the first means in parallel with the second means when an endurance characteristic greater than said first endurance characteristic is required in the selected one of the first means, so that data may be erased from and written to the latter first means many more times before wearout than with any of the other first means.

2. The device of claim 1, in which the programming means includes configurable means for inserting the selected one of the first means in parallel with the second means for purposes of simultaneously writing identical data to the selected first means and the second means, and subsequently reading that identical data therefrom.

3. An electrically erasable programmable read only memory (EEPROM) semiconductor device, including a memory section composed of multiple blocks of relatively low endurance memory, and means for selectively increasing the endurance of one of the blocks of memory to allow it to be repeatedly erased and written to over a lifetime considerably greater than that of any of the other blocks among the multiple blocks of memory, so that any one of said multiple blocks of memory may be selected for relatively high endurance in applications where the comparatively small data content thereof must be altered repeatedly over the lifetime of the device while the considerably larger data content of the remaining blocks of memory need be altered relatively fewer times.

4. The invention of claim 3, in which the means for selectively increasing endurance includes means for designating at will which one of the multiple blocks of memory is to have its endurance increased.

5. The invention of claim 4, in which the means for selectively increasing endurance further includes a separate block of memory of the same storage capacity as that of each of the multiple blocks of low endurance memory and having substantially the same low endurance characteristic, and means for programming the device to configure said separate block of memory in parallel with the designated one of the multiple blocks of memory to enable writing and reading the same data to and from both blocks of memory simultaneously.

6. An erasable programmable memory for use in split endurance applications in which a portion of the memory content must be altered a far greater number of times than the remainder of the memory content, comprising a plurality of memory means of substantially equal data storage capacity adapted for cyclical erasure and storage of data to be read therefrom over a limited substantially predetermined number of cycles until depleted, and enhancement means for adjusting a selected one of the plurality of memory means to enable it to erase and store data over a considerably greater number of cycles before depletion than said limited number.

7. The invention of claim 6, in which the enhancement means includes a separate redundant memory means of the same data storage capacity adapted for cyclical erasure and storage of data to be read therefrom over a number of cycles before depletion similar to said limited number of cycles of each of said plurality of memory means.

8. The invention of claim 7, in which the enhancement means further includes means for placing said redundant memory means in parallel with said selected one of the plurality of memory means for purposes of simultaneous erasure, storage and readout of data in the selected and redundant memory means.

9. A method of increasing the endurance for erasure and writing of data in a selected memory portion of an erasable programmable memory device, comprising:
   incorporating into the device a plurality of first memory portions each having the same data storage capacity and an endurance characteristic at least roughly defining the number of times that data may be erased from and written to the memory portion before it experiences wearout in which data can no longer be erased from and written to the memory portion,
   providing a redundant memory portion having the same data storage capacity and endurance characteristic as that of each of said first memory portions, and
   adapting the device for programmably coupling a selected one of said first memory portions for which higher endurance is required with the redundant memory portion so that data may be erased from and written to the selected first memory portion repeatedly over a much greater number of times before wearout than with any of the other first memory portions.

10. The method of claim 9, in which:
   the adapting step includes paralleling the selected one of said first memory portions with the redundant memory portion for purposes of simultaneously writing identical data thereto and subsequently reading that identical data therefrom.

11. An electrically erasable programmable read only memory (EEPROM) semiconductor device, including:
   a memory section composed of multiple blocks of relatively low endurance memory,
   means for selectively increasing the endurance of one of the blocks of memory to allow it to be repeatedly erased and written to over a lifetime considerably greater than that of any of the other blocks among the multiple blocks of memory, said means for selectively increasing endurance including
      means for designating at will which one of the multiple blocks of memory is to have its endurance increased including a separate block of memory of the same storage capacity as that of each of the multiple blocks of low endurance memory and having substantially the same low endurance characteristic, and means for programming the device to configure said separate block of memory in parallel with the designated one of the multiple blocks of memory to enable writing and reading the same data to and from both blocks of memory simultaneously, and
   fuse means for selectively disrupting access to the means for designating at will, so that such access may be disrupted at any time after designation of one of the multiple blocks of memory to have its endurance increased, and thereby prevent the designation from being altered.

12. An erasable programmable memory, comprising:
a plurality of memory means of substantially equal data storage capacity adapted for cyclical erasure and storage of data to be read therefrom over a limited substantially predetermined number of cycles until depleted;
enhancement means for adjusting a selected one of the plurality of memory means to enable it to erase and store data over a considerably greater number of cycles before depletion than said limited number, including a separate redundant memory means of the same said data storage capacity adapted for cyclical erasure and storage of data to be read therefrom over a number of cycles before depletion similar to said limited number of cycles of each of said plurality of memory means, and means for placing said redundant memory means in parallel with said selected one of the plurality of memory means for purposes of simultaneous erasure, storage and readout of data in the selected and redundant memory means; and fuse means for preventing the selection of said selected one of the plurality of memory means from being altered after being placed in parallel with said redundant memory means.

* * * * *